May 15, 1934. A. SENAUKE Re. 19,170
RADIORECEIVER
Original Filed Dec. 27, 1929
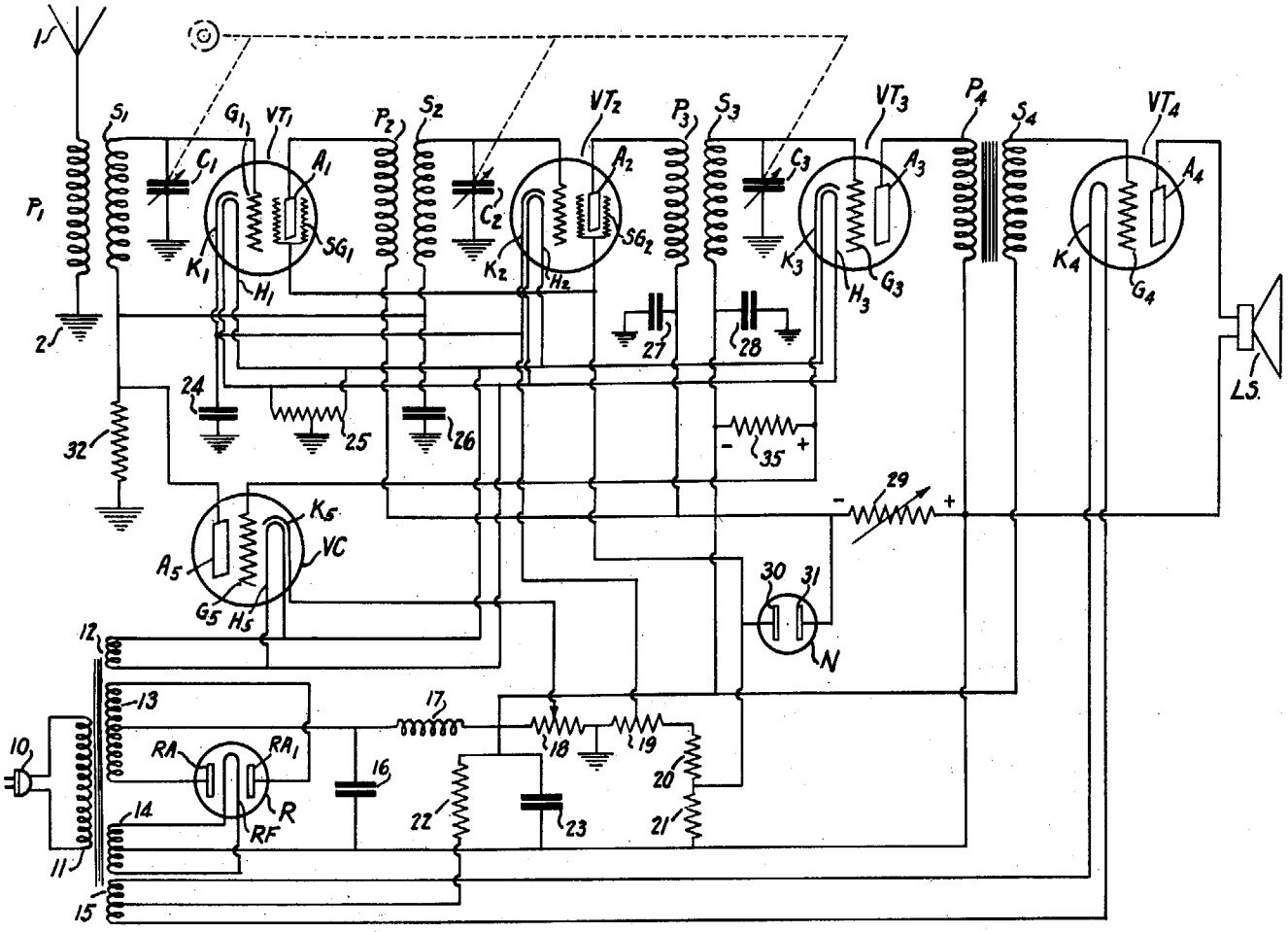
INVENTOR
Alexander Senauke
BY
Clyde A. Norton
ATTORNEY Reissued May 15, 1934

Re. 19,170

UNITED STATES PATENT OFFICE 19,170

RADIORECEIVER

Alexander Senauke, New York, N. Y.

Original No. 1,839,419, dated January 5, 1932, Serial No. 416,784, December 27, 1929. Application for reissue December 23, 1933, Serial No. 703,855

13 Claims. (Cl. 250—20)

This invention relates to radio receiving apparatus and more particularly to such apparatus adapted to be used for broadcast reception.

It is an object of this invention to provide an arrangement in which a visual signal such as a flash of light is given the operator whenever the receiving apparatus is operative and is tuned to an incoming carrier wave of predetermined strength.

It is a further object of this invention to provide an arrangement of the class described in which the intensity of illumination of the light is greatest when the receiver is tuned exactly to the carrier frequency and is less when the tuning departs from the carrier frequency.

It is still a further object of this invention to provide such an arrangement in which the light signal may be given without necessity for the closing of auxiliary contacts.

It is still a further object of the invention to provide an arrangement of the class described in which the signal lamp ceases to be illuminated as soon as the desired transmitting station ceases to operate even though the receiver remains tuned to the frequency of such transmitter.

It is still a further object of the invention to provide apparatus of the class described in which the signal lamp is arranged to be lighted during the warm-up period of the receiver and ceases to operate as soon as the receiver has been warmed up sufficiently to operate unless it is tuned to a particular transmitting station which is then operating.

Still further objects and advantages of my invention will be apparent from the specification. The features of novelty which I believe to be characteristic of my invention will be set forth with particularity in the appended claims. My invention itself, however, both as to its fundamental principles and as to its particular embodiments will best be understood by reference to the specification and accompanying drawing in which the single figure illustrates a circuit diagram of a complete receiver according to my invention.

Fundamentally my invention contemplates the use of a signal lamp connected between suitable points of the receiver across which points there is a drop of potential which increases when a carrier wave is being received. It will be understood that if one selects a pair of points between which for example there may normally exist a potential of 110 volts, when no signal is being received, but which potential increases to 120 volts when a carrier wave is being received, then it becomes possible to connect between these two points a lamp or equivalent visual indicator having such operating characteristics that it will not operate until the potential reaches the value of 115 volts, and will remain in operation so long as the potential exceeds this value.

I prefer to make use of a neon tube for this purpose, since such tubes are easily procurable and there is no particular difficulty in selecting a tube having the voltage characteristic desired, and because such a tube possesses the advantage that the illumination which it gives is to a certain extent proportional to the voltage impressed upon it. For example, at 110 volts it will give no light. At 115 volts it may give a faint light which light will increase in brilliancy to 120 volts and as the potential drops below this point the brilliancy likewise drops. In such an arrangement it will be understood the lamp may be placed upon the front of the panel or in other accessible position, and as the operator varies the tuning of the receiver the lamp will be illuminated when the operator selects a carrier wave of predetermined strength.

Since the voltage applied to the lamp is greatest when the receiver is tuned exactly to the carrier frequency and decreases as the tuning gets off the carrier frequency into carrier plus or minus sideband frequency, due to effects which will hereinafter be explained, such an arrangement serves not only as a visual signal for the presence of a station but serves the purpose of a tuning indicator showing clearly when the receiver is properly tuned. For example, when incorporated in a commercial receiver the operator may be instructed, in tuning in a station, to vary the tuning slightly until the lamp shines with its greatest brilliancy. This makes it possible for one to tune the receiver properly and be assured of freedom from distortion which might occur were the receiver tuned to some frequency in the range of carrier plus or minus sideband frequency.

Referring now more particularly to the drawing, in which I have indicated an alternating current operated receiver, I have shown a receiver involving two stages of radio frequency amplification employing screen grid tubes, a detector tube and one audio frequency amplifier tube operating a loud speaker, but it will be understood that my invention may be applied to receivers having a greater or lesser number of radio or audio frequency amplifying stages, the showing being merely by way of example.

1 indicates an antenna of any suitable type and 2 the ground. Interposed between the antenna and ground there is provided the primary $P_1$ of radio frequency transformer supplying the first radio frequency amplifying stage through secondary coil $S_1$ forming part of the input circuit of the first radio frequency amplifier tube $VT_1$. The lower end of secondary $S_1$ is effectively grounded at radio frequencies through condenser 26 and is tuned by means of condenser $C_1$ connected between the lower end of secondary $S_1$ and ground.

The first radio frequency amplifying stage comprises, as already stated, vacuum tube $VT_1$ herein shown as a screen grid heater type of tube but it will be understood that my invention is not limited to this particular type of tube, and that other types of tubes may be employed if desired. The tube $VT_1$ comprises heater $H_1$, arranged to be heated by alternating current and serving to heat the cathode $K_1$ to electron-emitting temperature. The anode or plate $A_1$ is provided with control grid $G_1$ as well as screen grid $SG_1$. Since the particular construction and mode of operation of this type of tube is well understood in the art and forms per se no part of my invention, the same is not described in detail.

The cathode $K_1$ is effectively grounded at radio frequencies through condenser 24. The plate circuit comprises primary $P_2$ of the coupling transformer which couples the vacuum tube $VT_1$ with the second stage of radio frequency amplification comprising vacuum tube $VT_2$. The upper side of the primary $P_2$ is connected directly to the plate or anode $A_1$ of $VT_1$ and the lower side is connected through resistance 29 to the positive side of the power supply unit indicated as plus.

The secondary $S_2$ coupled to primary $P_2$ is connected at its upper end to one side of tuning condenser $C_2$ and to the grid of tube $VT_2$ and at its lower end is effectively grounded at radio frequencies through condenser 26. The plate or anode $A_2$ of the vacuum tube $VT_2$ is connected through primary $P_3$ of the interstage coupling transformer supplying vacuum tube $VT_3$ and through resistance 29 again to the positive side of the power supply unit, and if desired a bypass condenser 27 may be connected between the lower side of coil $P_3$ and ground.

The secondary $S_3$ of the interstage coupling transformer is effectively grounded for radio frequencies through condenser 28 and is turned by variable condenser $C_3$ and is connected at its upper end to the grid $G_3$ of $VT_3$ which in this instance is arranged to operate as a detector. A common operating control may be provided for condensers $C_1$, $C_2$ and $C_3$, which may be operable manually or by remote control, as desired.

The output circuit of the tube $VT_3$ comprises primary $P_4$ of the audio frequency coupling transformer supplying the final output tube $VT_4$ and is connected to the positive side of the power supply but does not include the resistance 29. Secondary $S_4$ of said transformer is connected between the grid $G_4$ of the final output tube $VT_4$ and a suitable point on the power supply device, preferably negative with respect to the mean filament potential in order to provide a suitable negative bias between the cathode $K_4$ and grid $G_4$ of vacuum tube $VT_4$. The output circuit of the tube $VT_4$ includes a suitable signal responsive device such as loud speaker LS and is connected to the positive side of the power supply unit but does not include resistance 29.

The power supply circuit comprises for example plug 10 or other suitable connector adapted to be inserted in a standard alternating current house outlet and feeding the primary 11 of the power transformer having secondary winding 12 which may supply the heaters of tubes $VT_1$, $VT_2$ and $VT_3$ and VC in parallel, secondary winding 13 which supplies high voltage to the rectifier tube R, secondary winding 14 which supplies heating current to the filament of rectifier R and secondary winding 15 which may supply current to the filament of the tube $VT_4$.

The rectifier tube R is shown as comprising a pair of anodes RA and $RA_1$ and a filament RF operating in the well-known manner. The midpoint of winding 13 which is the negative side of the power supply is connected through condenser 16 to the midpoint of winding 14 which is the positive side of the power supply and choke 17 and resistances 18, 19, 20 and 21 may be connected in series between the midpoint of winding 13 and the midpoint of winding 14 as shown.

Condenser 23 is connected between choke 17 and resistance 18 on the one hand and the positive side of the power supply unit on the other, and resistance 22 may also be provided between the midpoint of winding 15 and a point intermediate choke 17 and resistance 18, from which it will be understood that the lower side of resistance 21 and the right hand side of resistance 29 which are connected together, represent the most positive point of the power supply system and the point intermediate resistance 18 and choke 17 represents the most negative point which can be obtained by the voltage drop through the resistances 18, 19, 20 and 21.

The various elements requiring direct potential difference therebetween are connected to proper points on these resistances. For example, as already stated, anodes $A_1$ and $A_2$ are connected through resistance 29 to this point. Anode $A_3$ is connected directly to this point. Screen grids $SG_1$ and $SG_2$ requiring lesser positive potential are connected at a point intermediate resistances 20 and 21.

In order to provide for a suitable negative bias for the grids of vacuum tubes $VT_1$ and $VT_2$ the cathodes $K_1$ and $K_2$ may be connected together and to a suitable point on resistance 19 and the point intermediate resistances 18 and 19 may be grounded, whereby it will be seen that the cathodes of these tubes are more positive than the grids, which are grounded through high resistance 32, of approximately 100,000 ohms. The grid returns of vacuum tubes $VT_3$ and $VT_4$ may be connected together and to a suitable point herein shown as intermediate resistance 18 and choke 17, whereby negative bias is maintained upon the grids of said tubes.

A suitable resistance 35 for example, 20,000 ohms, may be connected between the lower end of secondary $S_3$ and cathode $K_3$ for volume control purposes and a resistance 22 is connected between the midpoint of winding 15 and the point intermediate choke 17 and resistance 18. The negative bias upon the grids $G_1$ and $G_2$ of vacuum tubes $VT_1$ and $VT_2$ is dependent upon the flow of current through resistance 32 since it will be noted that these grids are directly grounded only through resistance 32. A high resistance 25 grounded at a suitable intermediate point is shunted across the heater supply line feeding tubes $VT_1$, $VT_2$ and $VT_3$ for the purpose of reducing AC hum.

For the purpose of providing an automatic volume control, that is to say for the purpose of maintaining full sensitivity when no signal is being received, and increasing the negative bias upon the grids of tubes $VT_1$ and $VT_2$ to decrease the volume of extremely strong signals, there is provided a volume control tube VC herein shown as having anode $A_5$, grid $G_5$, cathode $K_5$ and heater $H_5$. The cathode $K_5$ is connected to a suitable point upon the resistance 18 whereas the anode is connected through resistance 32 to ground and hence to the grounded point in the power supply circuit and is therefore positive with respect to the cathode $K_5$.

It will therefore be seen that the space current flowing in vacuum tube VC must traverse resistance 32 and therefore that the more the space current drawn by vacuum tube VC the greater the negative bias upon the grids of tubes $VT_1$ and $VT_2$ due to the increase in the drop through resistance 32. It will also be noted that the grid of the vacuum tube VC is maintained negative with respect to the cathode of said tube by reason of the connection of the cathode $K_5$ to an intermediate point upon resistance 18 and the connection of the grid through resistance 35 to the left hand side of resistance 18 which is negative with respect to any other point thereof. It will also be noted that resistance 35 is traversed by the space current of the detector tube $VT_3$ and the greater the space current flowing in tube $VT_3$ the greater the voltage drop due to the space current in resistance 35. The direction of the connections is so arranged that this voltage drop tends to counteract the negative bias normally existing upon the grid of vacuum tube VC.

The neon tube N comprises electrodes 30 and 31 and is shown as connected between the left hand terminal of resistance 29 and the common return from the screen grids. The operation of the system is as follows:

The detector is arranged for so-called power detection in such manner that the space current increases with the increase in strength of the received carrier as is well understood. The values of the various resistances are so designed with respect to the tube characteristics that when no signal is being received the biases are such as to maintain the radio frequency amplifying tubes in their most sensitive condition. When however the carrier is received space current flows in the tube $VT_3$ which tends to make the grid of the volume control tube VC become less negative with respect to its cathode and tube VC begins to draw space current. As will be seen, the greater the space current in the detector $VT_3$ the greater will be the positive potential difference impressed upon the grid of the volume control tube VC through resistance 35. As the grid of the volume control tube becomes more positive due to this action the tube begins to pass plate current causing a voltage drop through resistance 32 which tends to increase the negative bias upon the radio frequency amplifiers $VT_1$ and $VT_2$. Thus it will be seen that the stronger the signal initially received the greater will be the negative bias upon the radio frequency amplifiers and the smaller the actual output and the space current of these tubes.

In practice, by adjusting the various resistances to the proper value in accordance with the tube characteristics the effect is to maintain a constant volume level of signal from the loud speaker provided that the signal strength is sufficient to reach that volume level. Signals having a greater strength are automatically cut down to the desired level.

The neon tube N, it will be observed, is connected in such a manner that it is subject to the voltage drop through resistance 21 plus that through resistance 29, and it will be observed that the direction of connections is such that these two voltage drops are in opposition, and whereas the voltage drop through resistance 21 is substantially constant, the drop through resistance 29 is a maximum when no signal is being received and is a minimum when the strongest signals are being received, due to the operation on the volume control tube, as already explained, which impresses a negative bias on tubes $VT_1$ and $VT_2$ thereby decreasing the plate current. Consequently the voltage effective upon the neon tube N is greatest when the strongest signal is tuned in and decreases as the tuning is varied from resonance. Thus by proper selection of the neon tube and connection of the tube between the proper points the tube can be made to light when the receiver is tuned to an incoming carrier and the brilliancy will be greatest when the tuning is exactly at carrier frequency. When the receiver is first turned on an appreciable time is required for the cathodes $K_1$ and $K_2$ to reach electron-emitting temperature and no space current flows through these tubes. The voltage effective upon the neon tube is maximum. It will therefore be understood that when the set is first turned on the neon tube will light.

If the receiver is not tuned to an incoming signal, as the tubes warm up and begin to pass space current the intensity of illumination of the neon tube decreases and finally when the receiver reaches full sensitivity the tube is no longer lighted. Thus the tube serves to indicate to the operator that the end of the warm-up period has arrived and the receiver may then be tuned to select the desired station. This effect will not be had however to the full extent if the receiver happens to be tuned to a station which is operating, and which is of sufficient strength to cause operation of the volume control tube.

While I have shown and described certain preferred embodiments of my invention it will be understood that modifications and changes may be made without departing from the spirit and scope of my invention as will be understood by those skilled in the art. Particularly, while I have shown and described one method of connecting the neon tube it will be understood that this tube may be connected in many different ways to secure the effect, the principle being that it is connected between a pair of points in the power supply system in such manner that the voltage across it is greater when a signal is being received than when no signal is being received and, if desired, so that the voltage is greatest when the receiver is tuned exactly to carrier frequency.

The system lends itself particularly to automatic volume control arrangements in which incoming signals introduce in the radio frequency amplifier tubes a negative bias which is proportional to the strength of the incoming signal but it may be applied in any system wherein there is a net change in space current as the signal is tuned in.

While I prefer to utilize arrangements of the type shown, in which the lamp serves as an indication of any station being received, it is of course possible to provide a switch in the lamp circuit which switch is so related to the tuning apparatus that it is closed only at certain predetermined points where desired stations are heard. If appropriate markings are provided on the dial it is then possible to tune the receiver to the desired station and to know immediately whether said station is on the air even though it may not be modulating. If the lamp fails to light the operator will know that the station is not transmitting. If, on the other hand, the lamp lights, the operator will know that the station is transmitting even though it may not be modulating. Also in the event of a sudden termination of a program from the loud speaker a glance at the lamp will immediately tell whether the station has gone off the air or whether it has merely stopped modulating.

While I prefer to use a neon tube connected as described, it will be understood that other forms of lamps may be utilized, and that the visibility of the light signal may be controlled otherwise than by increasing the voltage on the lamp. For example, the light may be lighted from a power source whenever the receiver is turned on, and the change in voltage which I have described as directly energizing the lamp may be used to operate a relay which may for example withdraw a mask from the front of the lamp thus rendering the light visible to the operator only when a signal of predetermined strength is received.

It will be understood that by choosing the response characteristics of the neon lamp or other visual indicator and also the points of connection thereof to the circuit and the various resistance values, the signal strength required to cause illumination of the lamp may be limited in such manner that the lamp will respond only to signals having a strength corresponding to a local station. It is well known that fading, atmospheric disturbances, and the like are very much less objectionable when local stations are being received than when distant stations are being received, and choosing the operating characteristics in this manner makes it possible for the listener to tune his receiver to local stations if he so desires without knowledge of the particular point upon the dial where local stations are to be received. All that is necesssary is to vary the tuning until the light is illuminated whereupon the operator knows that he is receiving a local station.

Also if desired the characteristics may be so chosen that the light will light when a signal of sufficient strength to produce normal loud speaker volume is being received regardless of whether this be a local or a distant station. It will be understood that the stronger the signal to be received the greater the decrease in plate current of the radio frequency amplifier tubes in the present arrangement and in order to produce this operating characteristic it is only necessary to determinate the field strength of the carrier required to produce normal volume from the loud speaker and to so arrange the resistances and points of connection and to so choose the tube characteristic that the change in space current corresponding to a signal of this strength produces sufficient voltage to light the lamp while signals of lesser strength do not.

Also it will be understood that it is within the scope of my invention to invert, so to speak, the light operation; that is to say, to so arrange the circuit that the voltage upon the lamp or other visual indicator decreases when a signal of sufficient strength is tuned in, thereby permitting the lamp to operate at all times except when a signal is tuned in. In order to produce such an effect the lamp or other indicator may be connected directly in shunt to resistance 29 for example, in which case the voltage upon the lamp decreases with the increase in strength of the incoming signal instead of increasing.

Also, while I prefer to so choose the characteristics of the various parts so that the lamp becomes luminous only when the receiver is tuned sufficiently close to the carrier to be received to give a good signal in the loud speaker, the characteristics may be so chosen that the lamp glows faintly whenever the receiver is turned on, and the intensity of illumination increases to a maximum when the receiver is tuned to the carrier frequency of a signal. It will be understood that these various effects are produced by proper choice of the voltage response characteristics of the lamp and the voltage changes available for controlling the lamp.

I claim:

1. Radio receiving apparatus comprising, in combination, a series of thermionic vacuum tubes arranged to receive incoming signals and having an input and an output circuit, a power supply circuit for energizing said vacuum tubes and including an impedance path having a voltage drop therein, means for selecting the frequency of signals to be received, a control for said frequency selecting means and a signal receiving indicator comprising a lamp connected between points on said power supply circuit including said impedance path between which there exists a potential difference which increases when signals are being received.

2. Radio receiving apparatus comprising, in combination, a series of thermionic vacuum tubes arranged to receive signals and having an input and an output circuit, a power supply device including a rectifier and filter circuit for energizing said vacuum tubes, a frequency selector for determining the frequency of signals to be received, a control for said frequency selector and a gaseous discharge lamp connected between points on said power supply circuit between which there exists a potential difference which increases when signals are being received.

3. Radio receiving apparatus comprising, in combination, a series of thermionic vacuum tubes arranged to receive incoming signals and comprising a radio frequency amplifier, means for selecting the frequency of signals to be received, a control for said frequency selecting means, means for varying the bias upon said radio frequency amplifier to prevent increase of signal output above a predetermined volume level, a power supply circuit for energizing said tubes and a lamp connected between points on said power circuit between which a voltage exists which is sufficient to illuminate said lamp only when incoming signals of predetermined strength are being received.

4. Radio receiving apparatus comprising, in combination, a series of thermionic vacuum tubes arranged to receive signals and comprising a radio frequency amplifier tube, means controlled by incoming signals for impressing a bias upon said amplifier tube to decrease the amplification thereof in accordance with the increase in strength of incoming signals, a power supply circuit for supplying direct current to said amplifier, a constant current path associated therewith and a variable current path associated therewith, impedances in each of said paths and a lamp connected between points on said paths such that the algebraic sum of the drops in said impedances is applied across said lamp.

5. Radio receiving apparatus comprising, in combination, a series of thermionic vacuum tubes arranged to receive signals and comprising a radio frequency amplifier tube, a final output circuit and a loud speaker therein, means controlled by incoming signals for impressing a bias upon said amplifier tube to decrease the amplification thereof in accordance with the strength of incoming signals, a power supply circuit for supplying direct current to said amplifier and including resistance in the space current path of said amplifier, and a lamp connected between points in said power supply circuit including said resistance.

6. Radio receiving apparatus comprising, in combination, a series of thermionic vacuum tubes arranged to receive incoming signals and including a plurality of radio frequency amplifier tubes, a final output circuit and a loud speaker therein, means controlled by incoming signals for varying the operating characteristics of said tubes to decrease the space current thereof in accordance with the strength of incoming signals, a power supply circuit for supplying direct current to said radio frequency amplifier tubes, and including a resistance in the space current path of said radio frequency amplifier tubes, and a lamp connected between points in said power supply circuit including said resistance.

7. Radio receiving apparatus, comprising, in combination, signal selecting means, a series of thermionic vacuum tube amplifiers arranged to amplify incoming signals and a detector and comprising means for controlling the gain of said amplifiers inversely with the strength of incoming signals, a power supply circuit for supplying space current to said tubes, said power supply circuit including a rectifier, a filter, and impedance paths, and a gas discharge tube connected between points in said impedance paths between which there exists a voltage insufficient to cause illumination of said discharge tube when no signals are received, and which increases to a value sufficient to cause illumination thereof when said signal selector is tuned to resonance with an incoming signal of predetermined strength.

8. Radio receiving apparatus comprising, in combination, signal selecting means, a vacuum tube amplifier associated therewith, means for controlling the gain of said amplifier to cause increase thereof for weak signals, a power supply circuit for energizing said amplifier, and a pair of impedances in said power supply circuit so connected that the voltage drop through one of said impedances is substantially independent of incoming signals, and in the other decreases as incoming signals are tuned in and a gas discharge lamp connected across said impedances in such manner that the voltage drops are opposed in said lamp circuit.

9. Radio receiving apparatus comprising, in combination, signal selecting means, a vacuum tube amplifier associated therewith, a final output circuit from said receiver comprising a loud speaker, a power supply circuit for energizing said amplifier, and a pair of impedance paths associated with said power supply circuit, one of said impedance paths being traversed by a current substantially independent of incoming signals and the other being traversed by currents which decrease when incoming signals of predetermined strength are received, a gas discharge lamp, and connections between said lamp and points on said impedances so chosen that the difference in voltage drops through said impedances is effective on said lamp.

10. Radio receiving apparatus comprising, in combination, a series of thermionic vacuum tubes arranged to receive incoming signals and comprising a radio frequency amplifier, means for selecting the frequency of signals to be received, a power supply circuit for supplying space current to said tubes, and means controlled by the flow of space current from said power supply circuit to said radio frequency amplifier in normal operation for operating a light indicator showing the condition of tuning of said receiver.

11. Radio receiving apparatus comprising, in combination, a series of thermionic vacuum tubes arranged to receive incoming signals and comprising a radio frequency amplifier, means for selecting the frequency of signals to be received, a power supply circuit for supplying plate current to said radio frequency amplifier, a light indicator for furnishing a signal indicating the condition of tuning of said receiver, and means for controlling the operation of said light indicator, said means being operated by the change in direct current from said power supply circuit to said radio frequency amplifier when a signal above predetermined strength is tuned in.

12. Radio receiving apparatus comprising, in combination, a series of thermionic vacuum tubes arranged to receive incoming signals and comprising a radio frequency amplifier, means for selecting the frequency of signals to be received, a power supply circuit for supplying space current to said amplifier, said amplifier being so constructed and arranged that the space current therein changes when a signal is tuned in, a source of light, and means interposed in series in the space current path between said power supply circuit and said radio frequency amplifier for varying the light from said source to indicate the condition of tuning of said receiver.

13. Radio receiving apparatus comprising, in combination, a series of thermionic vacuum tubes arranged to receive incoming signals and comprising a radio frequency amplifier, automatic volume control means for decreasing the gain of said amplifier with increasing signal strength, whereby a change in space current of said amplifier occurs when said amplifier is tuned to incoming signals above a predetermined strength, means for selecting the frequency of signals to be received, a power supply circuit for supplying plate current to said radio frequency amplifier, and means controlled by the change in the current flowing from said power supply circuit to said amplifier for varying a light signal to indicate the condition of tuning of said receiver.

ALEXANDER SENAUKE.